(12) United States Patent
Shin

(10) Patent No.: US 9,659,638 B1
(45) Date of Patent: May 23, 2017

(54) DATA STORAGE DEVICE AND THE OPERATING METHOD THEREOF

(71) Applicant: SK hynix Inc., Gyeonggi-do (KR)

(72) Inventor: Beom Ju Shin, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/189,836

(22) Filed: Jun. 22, 2016

(30) Foreign Application Priority Data

Mar. 2, 2016 (KR) .......................... 10-2016-0025147

(51) Int. Cl.
| | | |
|---|---|---|
| G11C 16/26 | (2006.01) | |
| G11C 16/08 | (2006.01) | |
| G11C 11/56 | (2006.01) | |
| G11C 16/04 | (2006.01) | |

(52) U.S. Cl.
CPC .......... *G11C 11/5642* (2013.01); *G11C 16/08* (2013.01); *G11C 16/0483* (2013.01); *G11C 16/26* (2013.01)

(58) Field of Classification Search
CPC .............................. G11C 16/26; G11C 16/0483
USPC ............ 365/185.03, 185.11, 185.12, 185.17
See application file for complete search history.

(56) References Cited

U.S. PATENT DOCUMENTS

| | | | | |
|---|---|---|---|---|
| 5,977,996 A * | 11/1999 | Kondo | ..................... | G09G 5/39 345/531 |
| 2009/0168534 A1* | 7/2009 | Park | ........................ | G11C 5/02 365/185.17 |
| 2010/0042774 A1* | 2/2010 | Yang | ................... | G06F 12/0246 711/103 |
| 2010/0329018 A1* | 12/2010 | Joo | ..................... | G11C 11/5642 365/185.18 |
| 2013/0145093 A1* | 6/2013 | Kaminaga | ............ | G11C 7/1051 711/114 |
| 2016/0011779 A1* | 1/2016 | Lee | ......................... | G06F 3/061 711/103 |

FOREIGN PATENT DOCUMENTS

KR     101424782     8/2014

* cited by examiner

*Primary Examiner* — Ly D Pham
(74) *Attorney, Agent, or Firm* — IP & T Group LLP

(57) ABSTRACT

A data storage device includes a nonvolatile memory device including a first plane and a second plane; and a controller configured to provide a read command for reading simultaneously the first plane and the second plane, a first address for accessing the first plane and a second address for accessing the second plane, to the nonvolatile memory device, wherein the nonvolatile memory device reads all page types that should be read from the first plane and the second plane, from each of the first plane and the second plane, according to the read command, the first address and the second address.

22 Claims, 12 Drawing Sheets

| Page that should be read in PL1 | Page that should be read in PL2 | Page to be read in each page |
|---|---|---|
| LPG | LPG | LPG |
| LPG | MPG | LPG & MPG |
| MPG | LPG | LPG & MPG |
| MPG | MPG | MPG |

| Page that should be read in PL1 | Page that should be read in PL2 | Page to be read in each page |
|---|---|---|
| LPG | LPG | LPG |
|  | CPG | LPG & CPG |
|  | MPG | LPG & MPG |
| CPG | LPG | LPG & CPG |
|  | CPG | CPG |
|  | MPG | CPG & MPG |
| MPG | LPG | LPG & MPG |
|  | CPG | CPG & MPG |
|  | MPG | MPG |

DATA STORAGE DEVICE AND THE OPERATING METHOD THEREOF

CROSS-REFERENCES TO RELATED APPLICATION

The present application claims priority under 35 U.S.C. §119(a) to Korean application number 10-2016-0025147, filed on Mar. 2, 2016, in the Korean Intellectual Property Office, which is incorporated herein by reference in its entirety.

BACKGROUND

1. Technical Field

Various embodiments generally relate to a data storage device including a nonvolatile memory device as a storage medium.

2. Related Art

Recently, the paradigm for the computer environment has been converted into ubiquitous computing so that computer systems can be used anytime and anywhere. Due to this, use of portable electronic devices such as, for example, mobile phones, digital cameras, and notebook computers has rapidly increased. In general, such portable electronic devices use a data storage device which uses a memory device. A data storage device is used to store data to be used in a portable electronic device.

A data storage device using a memory device provides advantages in that, since there is no mechanical driving part, stability and durability are excellent, information access speed is high and power consumption is small. Examples of data storage devices having such advantages include a universal serial bus (USB) memory device, memory cards having various interfaces, a universal flash storage (UFS) device, and a solid state drive (SSD).

SUMMARY

Various embodiments are directed to a data storage device having improved read performance.

In an embodiment, a data storage device may include: a nonvolatile memory device including a first plane and a second plane; and a controller configured to provide a read command for reading simultaneously the first plane and the second plane, a first address for accessing the first plane and a second address for accessing the second plane, to the nonvolatile memory device, wherein the nonvolatile memory device reads all page types that should be read from the first plane and the second plane, from each of the first plane and the second plane, according to the read command, the first address and the second address.

In an embodiment, a data storage device may include: a nonvolatile memory device including a memory cell region that includes a first plane including a first logical page and a second logical page configured by memory cells coupled to a same word line and a second plane including a first logical page and a second logical page configured by memory cells coupled to a same word line; and a controller configured to provide a read command, a first address for accessing the first logical page of the first plane and a second address for accessing the second logical page of the second plane, to the nonvolatile memory device, wherein the nonvolatile memory device simultaneously reads the first logical page and the second logical page of the first plane and the first logical page and the second logical page of the second plane.

In an embodiment, a method for operating a data storage device including a nonvolatile memory device including a first plane and a second plane may include: providing, by a controller, a read command for reading simultaneously the first plane and the second plane, a first address for accessing the first plane and a second address for accessing the second plane, to the nonvolatile memory device; and reading, by the nonvolatile memory device, all page types that should be read from the first plane and the second plane, from each of the first plane and the second plane, according to the read command, the first address and the second address.

According to the embodiments, read performance of a data storage device may be improved.

DETAILED DESCRIPTION

Figure 1:
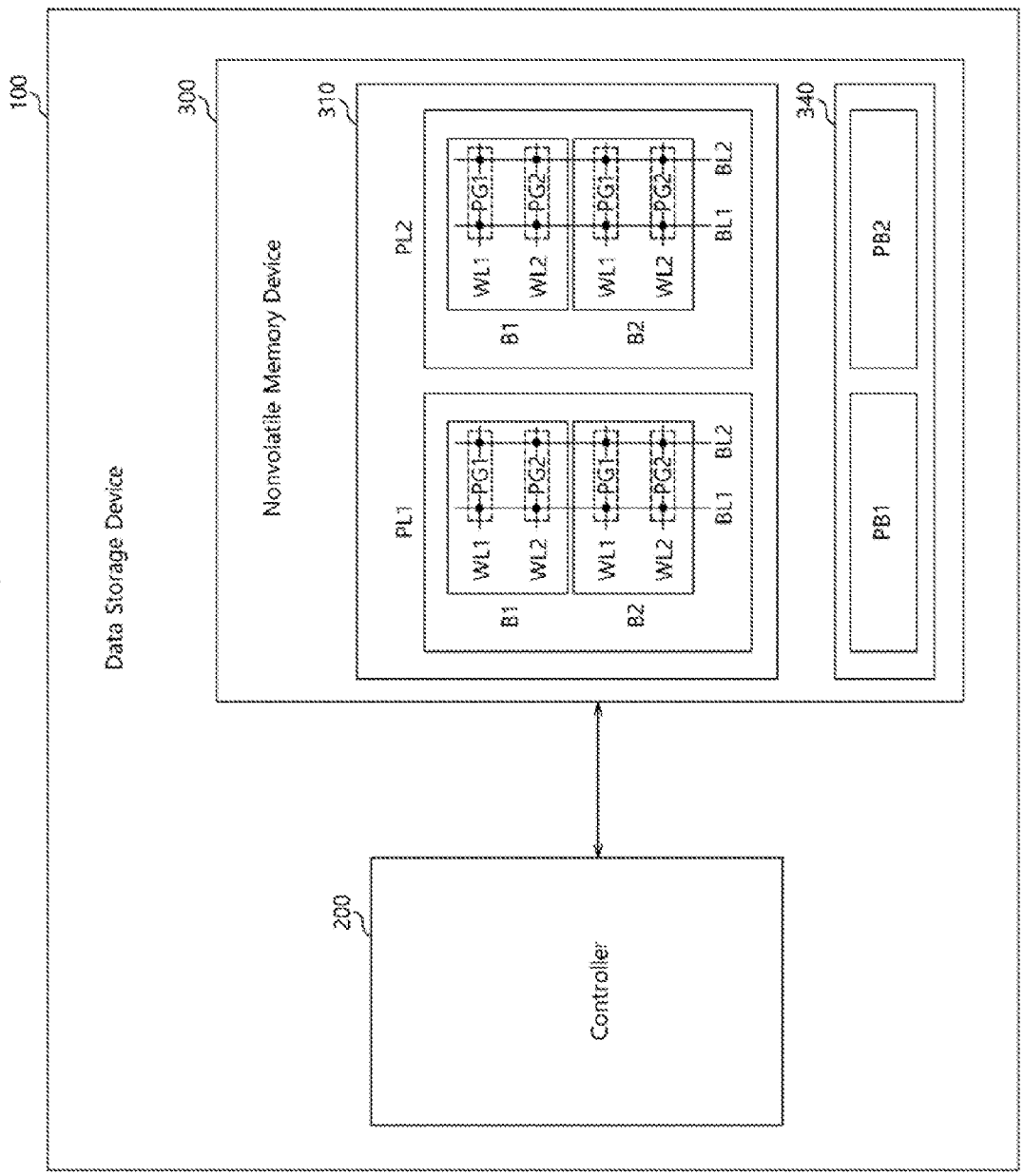
FIG. 1 is a block diagram illustrating a data storage device in accordance with an embodiment of the present invention.

In the present invention, advantages, features and methods for achieving them will become more apparent after a reading of the following exemplary embodiments taken in conjunction with the drawings. The present invention may, however, be embodied in different forms and should not be construed as being limited to the embodiments set forth herein. Rather, these embodiments are provided to describe the present invention in sufficient detail to enable a person skilled in the art to which the invention pertains to practice the present invention.

It is to be understood herein that embodiments of the present invention are not limited to the particulars shown in the drawings and that the drawings are not necessarily to scale and in some instances proportions may have been exaggerated in order to more clearly depict certain features of the invention. While particular terminology is used herein, it is to be appreciated that the terminology used herein is for the purpose of describing particular embodiments only and is not intended to limit the scope of the present invention.

As used herein, the term "and/or" Includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of one or more other elements.

Unless otherwise defined, all terms including technical and scientific terms used herein have the same meaning as commonly understood by one of ordinary skill in the art to which the present invention belongs. It will be further understood that terms, such as, for example, those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention, including a data storage device, will be described in detail with reference to the attached drawings.

Referring now to FIG. 1 a data storage device 100 is provided, in accordance with an embodiment of the present invention.

According to the embodiment of FIG. 1, the data storage device 100 may include a controller 200 and a nonvolatile memory device 300.

The data storage device 100 may store data to be accessed by a host device (not shown), such as, for example, a mobile phone, an MP3 player, a laptop computer, a desktop computer, a game player, a TV, an in-vehicle infotainment system, and the like. The data storage device 100 may also be referred to as a memory system.

The data storage device 100 may be manufactured as any one of various storage devices according to the protocol of an interface which is coupled electrically with the host device. For example, the data storage device 100 may be configured as any one of various storage devices, such as, for example, a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and the like.

The data storage device 100 may be manufactured as any one among various packages, such as, for example, a package-on-package (POP), a system-in-package (SIP), a system-on-chip (SOC), a multi-chip package (MCP), a chip-on-board (COB), a wafer-level fabricated package (WFP), and a wafer-level stack package (WSP).

The controller 200 may drive an instruction or an algorithm of a code type, (e.g., a software), and may analyze and process a request inputted from the host device. The controller 200 may control a nonvolatile memory device 300 to process a request from the host device. The controller 200 may generate control signals for controlling the operation of the nonvolatile memory device 300, for example, commands, addresses, control clock signals and the like, and provide the generated control signals to the nonvolatile memory device 300.

The nonvolatile memory device 300 may operate as a storage medium of the data storage device 100. The nonvolatile memory device 300 may be configured by any one of various types of nonvolatile memory devices such as, for example, a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PCRAM) using a chalcogenide alloy, and a resistive random access memory (RERAM) using a transition metal oxide. The ferroelectric random access memory (FRAM), the magnetic random access memory (MRAM), the phase change random access memory (PCRAM) and the resistive random access memory (RERAM) are a kind of nonvolatile random access memory devices capable of random access to memory cells. The nonvolatile memory device 300 may be configured by a combination of a NAND flash memory device and the above-described various types of nonvolatile random access memory devices. In the following descriptions, the nonvolatile memory device 300 which is configured by a NAND flash memory device will be exemplified.

The nonvolatile memory device 300 may include a memory cell region 310 and a page buffer 340. The memory cell region 310 may include a plurality of planes. Each of the plurality of planes may include a plurality of memory blocks. The page buffer 340 may include a plurality of page buffers 340, each corresponding to the plurality of planes.

As an example, the memory cell region 310 may configure two (2) planes PL1 and PL2 each including two (2) memory blocks B1 and B2. Each of the memory blocks B1 and B2 is exemplified to include 4 memory cells which are arranged at areas where 2 word lines WL1 and WL2 and 2 bit lines BL1 and BL2 intersect with each other. The number of planes in the memory cell region 310, the number of memory blocks in each plane and the number of memory cells in each memory block may be changed according to design.

From an operational or a physical (or structural) viewpoint, the memory cells included in the memory cell region 310 may be configured into a hierarchical memory cell set or memory cell unit. For example, memory cells which are coupled to the same word line WL and are to be read and programmed simultaneously may be configured into a page PG. In the following description, memory cells configured into a page PG will be referred to as a "page." Also, memory cells to be erased simultaneously may be configured into a memory block B. Memory cells to be controlled by different page buffers PB1 and PB2 may be configured into different planes PL.

The two plane memory cell architecture, allows memory cells included in different planes PL1 and PL2 to be read or programmed in parallel or individually because they are controlled by the respective corresponding page buffers PB1 and PB2. Specifically, PB1 controls PL1 and PB2 controls PL2. Hence, memory cells included in the different planes PL1 and PL2 may be read or programmed in parallel or individually regardless of their memory block and page address. For example, a first page PG1 of a first memory block B1 of a first plane PL1 and a second page PG2 of a second memory block B2 of a second plane PL2 may be read or programmed in parallel or individually although memory block addresses and page addresses are different from each other.

By using such a characteristic of the memory cell region 310 of the nonvolatile memory device 300, the controller 200 may control an MPMP read operation for the nonvolatile memory device 300. If the nonvolatile memory device 300 is controlled to perform an MPMP read operation, data stored in pages included in different planes may be sensed regardless of their memory block and page addresses in each of the respective planes, and may be randomly outputted as may be needed. An MPMP read operation will be described in detail with reference to the following drawings.

The page buffers PB1 and PB2 respectively corresponding to the planes PL1 and PL2 may operate as write drivers or sense amplifiers according to an operation mode. For example, in a program operation, the page buffers PB1 and PB2 may operate as write drivers for storing data provided from the controller 200 in pages of the corresponding planes PL1 and PL2. For another example, in a read operation, the page buffers PB1 and PB2 may operate as sense amplifiers which sense data from pages of the corresponding planes PL1 and PL2. Although descriptions will be made with reference to FIG. 9, each of the page buffers PB1 and PB2 may include latches corresponding to page types.

Figure 2:
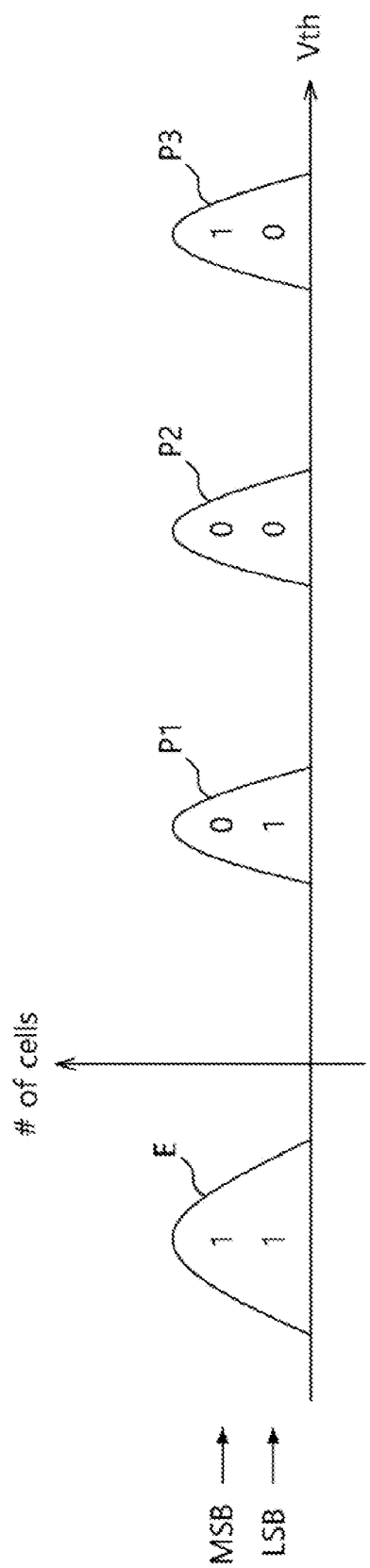
FIG. 2 is a diagram illustrating an example of threshold voltage distributions of memory cells, in accordance with an embodiment of the present invention.

FIG. 2 is a diagram illustrating an example of threshold voltage distributions of memory cells in accordance with an embodiment of the present invention. Each of the memory cells included in the memory cell region 310 of FIG. 1 may be configured by a multi-level cell (MLC) capable of storing 2 or more-bit data. In the case where the memory cells included in the memory cell region 310 of FIG. 1 are configured by 2-bit multi-level cells (2 bit-MLC) each capable of storing 2-bit data, the memory cells may be erased and programmed to have the threshold voltage distributions shown in FIG. 2.

That is to say, the memory cells may be erased to have threshold voltages of an erase state E. Also, the memory cells may be programmed to have threshold voltages of any one among a plurality of program states P1, P2 and P3 according to least significant bit (LSB) data (or lower bit data) and most significant bit (MSB) data (or upper bit data).

Figures 3, 4:
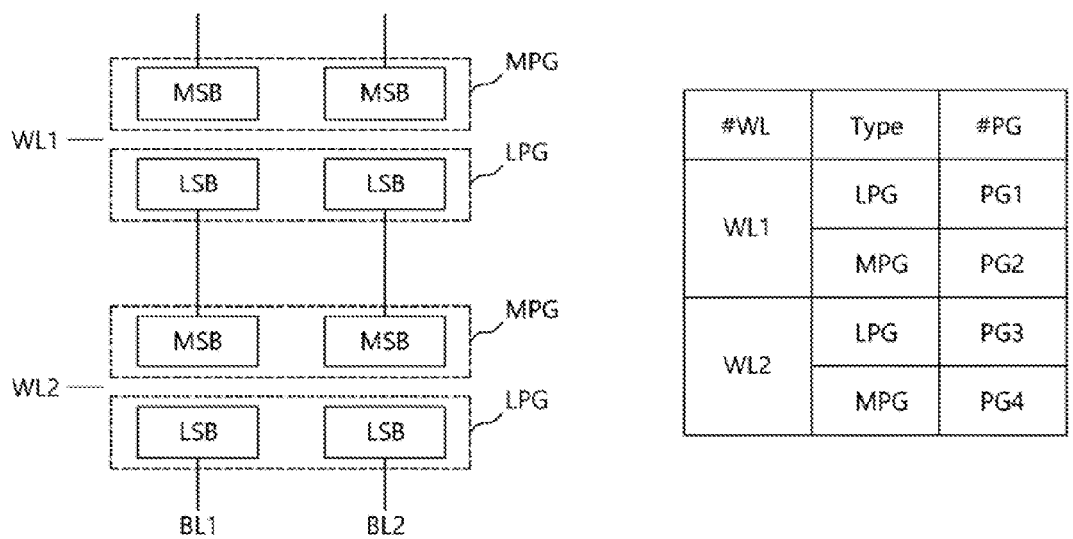
FIG. 3 is a diagram illustrating page addresses and page types, in accordance with an embodiment of the present invention.
FIG. 4 is a table illustrating examples of pages to be read in a multi-plane, multi-page (MPMP) scheme, in accordance with an embodiment of the present invention.

FIG. 3 is a diagram illustrating page addresses and page types, in accordance with an embodiment of the present invention. FIG. 3 exemplarily shows configurations of pages (i.e., page addresses and page types), in the case where the memory cells included in the memory cell region 310 of FIG. 1 are configured by 2-bit, multi-level cells (2 bit-MLC) as described above with reference to FIG. 2.

Each memory cell may configure different types of pages according to the types of data stored therein. Because physically one memory cell may configure virtually different types of pages, the pages may be referred to as logical pages. In other words, in the case where data stored in a memory cell is LSB data, the memory cell may configure an LSB page LPG (hereafter, referred to as an LSB page) or a first logical page. Also, in the case where data stored in a memory cell is MSB data, the memory cell may configure an MSB type page MPG (hereafter, referred to as an MSB page) or a second logical page.

According to such a configuration scheme, memory cells coupled to the first word line WL1 and the respective bit lines BL1 and BL2 may be configured as an LSB page LPG and an MSB page MPG. Also, memory cells coupled to the second word line WL2 and the respective bit lines BL1 and BL2 may be configured as an LSB page LPG and an MSB page MPG.

The LSB page LPG and the MSB page MPG of the first word line WL1 and the LSB page LPG and the MSB page MPG of the second word line WL2 may be allocated with different page numbers #PG (I.e., page addresses). For example, the LSB page LPG of the first word line WL1 may be allocated with a page address as a first page PG1, the MSB page MPG of the first word line WL1 may be allocated with a page address as a second page PG2, the LSB page LPG of the second word line WL2 may be allocated with a page address as a third page PG3, and the MSB page MPG of the second word line WL2 may be allocated with a page address as a fourth page PG4.

The controller 200 may, by providing a page address, access any one of the LSB page LPG or the MSB page MPG of either the first or second word lines. For example, by providing a page address PG1 the controller may access the LSB page LPG of the first word line WL1. Also as an example, by providing a page address PG2 the controller may access the MSB page MPG of the first word line.

FIG. 4 is a table illustrating examples of pages to be read in a MPMP scheme, in accordance with an embodiment of the present invention. FIG. 4 exemplarily shows pages to be read in the MPMP scheme, in the case where the memory cells included in the memory cell region 310 of FIG. 1 are configured by 2-bit multi-level cells bit-MLC) as described above with reference to FIG. 2.

According to the MPMP scheme, different types of pages may be simultaneously read from each of the multiple planes. Namely, logical pages to be read from any one plane may include not only a logical page that should be read from the corresponding plane but also logical pages that should be read from the other planes.

According to the embodiment of FIG. 4, for example, when an LSB page LPG should be read from the first plane PL1 and an MSB page MPG should be read from the second plane PL2, if a read operation is performed according to the MPMP scheme, the LSB page LPG and the MSB page MPG may be read simultaneously from both the first plane PL1 and from the second plane PL2. For another example, when the MSB page MPG should be read from the first plane PL1 and the LSB page LPG should be read from the second plane PL2, if a read operation is performed according to the MPMP scheme, the LSB page LPG and the MSB page MPG may be read both from the first plane PL1 and from the second plane PL2.

Hence, according to the MPMP scheme, the same type of pages may be read simultaneously from each of the plurality of planes. That is to say, a logical page to be read from any one plane may include only a logical page that should be read from the corresponding plane.

According to the embodiment of FIG. 4, for example, when the LSB page LPG should be read from the first plane PL1 and the LSB page LPG should be read from the second plane PL2, if a read operation is performed according to the MPMP scheme, only the LSB page LPG may be read from the first plane PL1 and also only the LSB page LPG may be read from the second plane PL2. For another example, when the MSB page MPG should be read from the first plane PL1 and the MSB page MPG should be read from the second plane PL2, if a read operation is performed in the MPMP scheme, only the MSB page MPG may be read from the first plane PL1 and also only the MSB page MPG may be read from the second plane PL2.

Still referring to FIG. 4, when the LSB page LPG should be read from the first plane PL1 and the MSB page MPG should be read from the second plane PL2, if a read operation is performed according to the MPMP scheme, then both the LSB page LPG and the MSB page MPG may be read from both the first and second planes PL1 and PL2. Otherwise, when the MSB page MPG should be read from the first plane PL1 and the LSB page LPG should be read from the second plane PL2, if a read operation is performed according to the MPMP scheme, then both the LSB page LPG and the MSB page MPG may be read from both the first and second planes PL1 and PL2.

Hence, when a MPMP read operation is performed, all page types that should be read from each of the planes are read from the respective planes in the same manner. In other words, when the MPMP read operation is performed, data included in different planes and stored in different types of pages are sensed simultaneously by one read operation.

Figure 5:
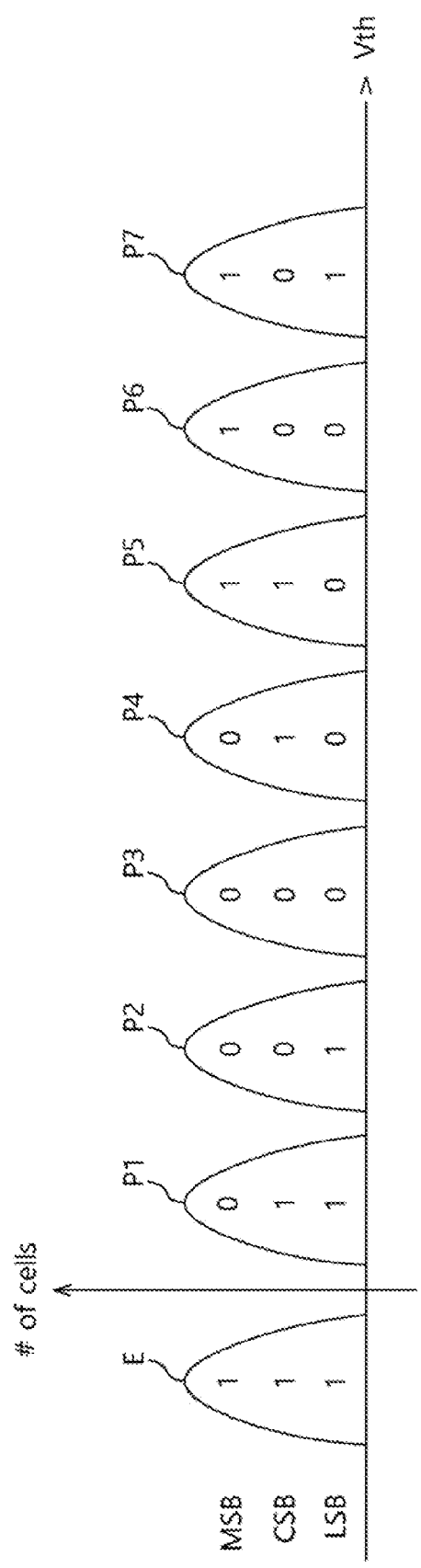
FIG. 5 is a diagram illustrating another example of threshold voltage distributions of memory cells, in accordance with an embodiment of the present invention.

FIG. 5 is a diagram illustrating another example of threshold voltage distributions of memory cells, in accordance with an embodiment of the present invention. In the case where the memory cells included in the memory cell region 310 of FIG. 1 are configured by 3-bit multi-level cells (3 bit-MLC) each capable of storing 3-bit data, the memory cells may be erased and programmed to have the threshold voltage distributions shown in FIG. 5.

That is to say, the memory cells may be erased to have threshold voltages of an erase state E. Also, the memory cells may be programmed to have threshold voltages of any one among a plurality of program states P1, P2, P3, P4, P5, P6 and P7 according to least significant bit (LSB) data (or lower bit data), central significant bit (CSB) data (or middle bit data) and most significant bit (MSB) data (or upper bit data).

Figures 6, 7:
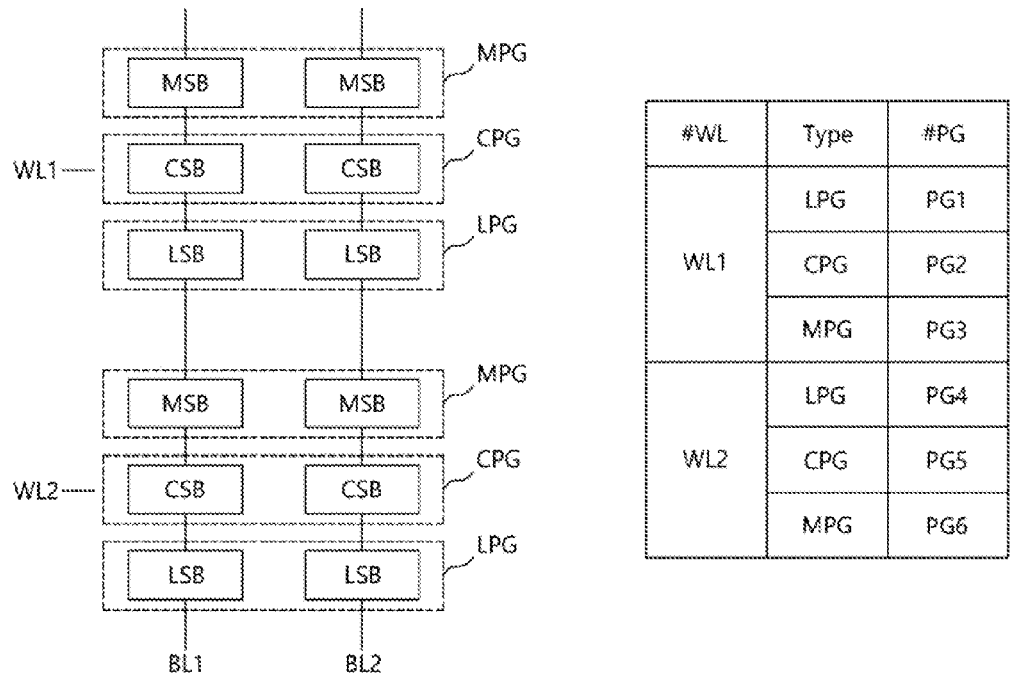
FIG. 6 is a diagram illustrating page addresses and page types, in accordance with another embodiment of the present invention.
FIG. 7 is a table illustrating examples of pages to be read in an MPMP scheme, in accordance with another embodiment of the present invention.

FIG. 6 is a diagram illustrating page addresses and page types, in accordance with another embodiment of the present invention. FIG. 6 exemplarily shows configurations of pages (i.e., page addresses and page types), in the case where the memory cells included in the memory cell region 310 of FIG. 1 are configured by 3-bit, multi-level cells (3 bit-MLC) as described above with reference to FIG. 5.

Each memory cell may configure different types of pages according to the types of data stored therein. Because physically one memory cell may configure virtually different types of pages, pages may be referred to as logical pages. In other words, in the case where data stored in a memory cell is LSB data, the memory cell may configure an LSB type page LPG (hereafter, referred to as an LSB page) or a first logical page. In the case where data stored in a memory cell is CSB data, the memory cell may configure a CSB type page CPG (hereafter, referred to as a CSB page) or a second logical page. Also, in the case where data stored in a memory cell is MSB data, the memory cell may configure an MSB type page MPG (hereafter, referred to as an MSB page) or a third logical page.

According to such a configuration scheme, memory cells coupled to the first word line WL1 and the respective bit lines BL1 and BL2 may be configured as an LSB page LPG, a CSB page CPG and an MSB page MPG. Also, memory cells coupled to the second word line WL2 and the respective bit lines BL1 and BL2 may be configured as an LSB page LPG, a CSB page CPG and an MSB page MPG.

The LSB page LPG, the CSB page CPG and the MSB page MPG of the first word line WL1 and the LSB page LPG, the CSB page CPG and the MSB page MPG of the second word line WL2 may be allocated with different page numbers #PG (i.e., page addresses). For example, the LSB page LPG of the first word line WL1 may be allocated with a page address as a first page PG1, the CSB page CPG of the first word line WL1 may be allocated with a page address as a second page PG2, the MSB page MPG of the first word line WL1 may be allocated with a page address as a third page PG3, the LSB page LPG of the second word line WL2 may be allocated with a page address as a fourth page PG4, the CSB page CPG of the second word line WL2 may be allocated with a page address as a fifth page PG5, and the MSB page MPG of the second word line WL2 may be allocated with a page address as a sixth page PG6.

The controller 200 may, by providing a page address PG1 to PG6, access the LSB page LPG, the CSB page CPG and the MSB page MPG of the first word line WL1 and the LSB page LPG, the CSB page CPG and the MSB page MPG of the second word line WL2, respectively. For example, the controller 200 may provide page address PG1 to access the LSB page LPG of the first word line.

FIG. 7 is a table illustrating examples of pages to be read in a MPMP scheme in accordance with another embodiment of the present invention. FIG. 7 exemplarily shows pages to be read in the MPMP scheme, in the case where the memory cells included in the memory cell region 310 of FIG. 1 are configured by 3-bit multi-level cells (3 bit-MLC) as described above with reference to FIG. 5.

If different types of pages are read from respective planes in the MPMP scheme, different types of pages may be simultaneously read from each of the planes. Namely, logical pages to be read from any one plane may include not only a logical page that should be read from the corresponding plane but also logical pages that should be read from the other planes.

According to the embodiment of FIG. 7, for example, when the LSB page LPG should be read from the first plane PL1 and the CSB page CPG should be read from the second plane PL2, if a read operation is performed in the MPMP scheme, the LSB page LPG and the CSB page CPG may be read from the first plane PL1 and also the LSB page LPG and the CSB page CPG may be read from the second plane PL2. For another example, when the CSB page CPG should be read from the first plane PL1 and the MSB page MPG should be read from the second plane PL2, if a read operation is performed in the MPMP scheme, the CSB page CPG and the MSB page MPG may be read from the first plane PL1 and also the CSB page CPG and the MSB page MPG may be read from the second plane PL2. For still another example, when the MSB page MPG should be read from the first plane PL1 and the LSB page LPG should be read from the second plane PL2, if a read operation is performed in the MPMP scheme, the LSB page LPG and the MSB page MPG may be read from the first plane PL1 and also the LSB page LPG and the MSB page MPG may be read from the second plane PL2.

If the same type of pages are read from respective planes in the MPMP scheme, the same type of pages may be read from the respective planes. That is to say, a logical page to be read from any one plane may include only a logical page that should be read from the corresponding plane.

According to the embodiment of FIG. 7, for example, when the LSB page LPG should be read from the first plane PL1 and the LSB page LPG should be read from the second plane PL2, if a read operation is performed in the MPMP scheme, only the LSB page LPG may be read from the first plane PL1 and also only the LSB page LPG may be read from the second plane PL2. For another example, when the CSB page CPG should be read from the first plane PL1 and the CSB page CPG should be read from the second plane PL2, if a read operation is performed in the MPMP scheme, only the CSB page CPG may be read from the first plane PL1 and also only the CSB page CPG may be read from the second plane PL2. For still another example, when the MSB page MPG should be read from the first plane PL1 and the MSB page MPG should be read from the second plane PL2, if a read operation is performed in the MPMP scheme, only the MSB page MPG may be read from the first plane PL1 and also only the MSB page MPG may be read from the second plane PL2.

If a multi-plane, multi-page (MPMP) read operation is performed, all page types that should be read from each of planes may be read from the respective planes in the same manner. In other words, if the MPMP read operation is performed, data included in different planes and stored in different types of pages may be sensed simultaneously by one read operation.

Figure 8:
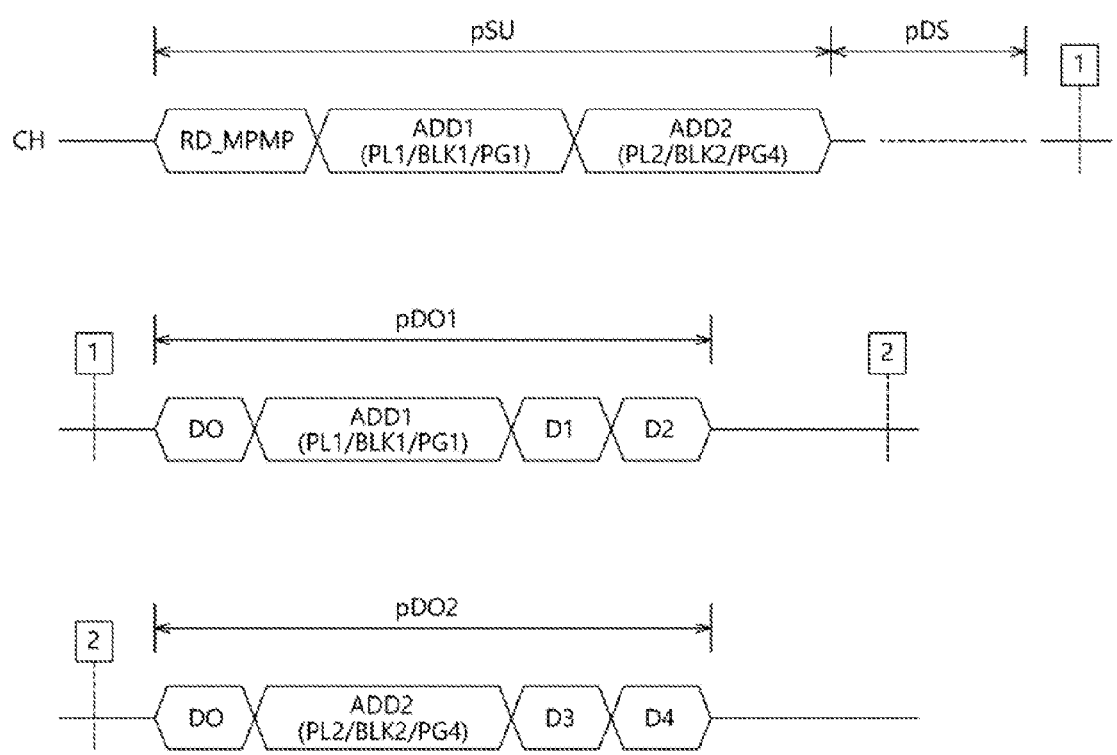
FIG. 8 is a diagram illustrating a control flow of a controller which controls an MPMP read operation of a nonvolatile memory device.
Figure 9:
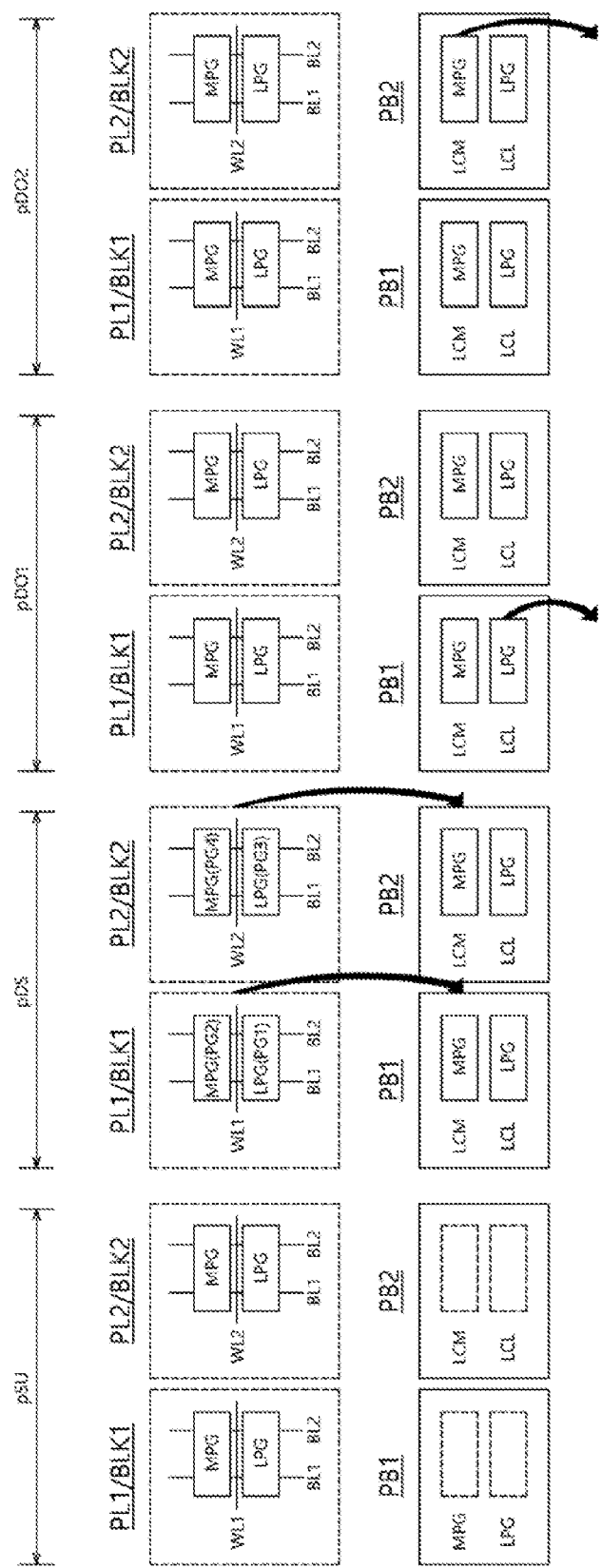
FIG. 9 is a diagram illustrating a state of a nonvolatile memory device performing an MPMP read operation under the control of a controller, according to an embodiment of the invention.

FIG. 8 is a diagram illustrating a control flow of a controller which controls an MPMP read operation to be performed in a nonvolatile memory device. FIG. 9 is a diagram illustrating a state of a nonvolatile memory device performing an MPMP read operation according to control of a controller. FIGS. 8 and 9 exemplarily show the MPMP read operation of the nonvolatile memory device 300 to be performed according to control of the controller 200, in the case where the memory cells included in the memory cell region 310 of FIG. 1 are configured by 2-bit, multi-level cells (2 bit-MLC) as described above with reference to FIG. 2.

The MPMP read operation may be divided into a set-up period pSU, a data sensing period pDS and data output periods pDO1 and pDO2.

The set-up period pSU may be defined as a period in which the controller 200 controls the nonvolatile memory device 300 so that the MPMP read operation is performed. During the set-up period pSU, the controller 200 may operate as a subject that provides control signals (e.g., a command and an address), to the nonvolatile memory device 300. The nonvolatile memory device 300 may operate as an object that receives the control signals.

The controller 200 may provide to the nonvolatile memory device 300 an MPMP read command RD_MPMP and addresses ADD1 and ADD2 for which the MPMP read operation is to be performed.

A first address ADD1 may be an address for accessing a page included in the first plane PL1. For example, as illustrated in FIGS. 8 and 9, the first address ADD1 for accessing the first page PG1 of the first memory block BLK1 of the first plane PL1 is provided to the nonvolatile memory device 300 by the controller 200. A second address ADD2 may be an address for accessing a page included in the second plane PL2. For example, as illustrated in FIGS. 8 and 9, that the second address ADD2 for accessing the fourth page PG4 of the second memory block BLK2 of the second plane PL2 is provided to the nonvolatile memory device 300 by the controller 200.

The data sensing period pDS is a period during which the nonvolatile memory device 300 performs a read operation internally, according to the control signals provided during the set-up period pSU, that is, the MPMP read command RD_MPMP and the addresses ADD1 and ADD2. During the data sensing period pDS, the respective page buffers PB1 and PB2 of the nonvolatile memory device 300 may sense data stored in pages corresponding to the addresses ADD1 and ADD2, and may store the sensed data in latches LCL and LCM corresponding to the types of the sensed pages.

For example, the first page buffer PB1 corresponding to the first plane PL1 may sense data stored in the first page PG1 of the first memory block BLK1, and may store the sensed data in an LSB latch LCL corresponding to the type of the first page PG1, that is, the LSB page. The second page buffer PB2 corresponding to the second plane PL2 may sense data stored in the fourth page PG4 of the second memory block BLK2, and may store the sensed data in an MSB latch LCM corresponding to the type of the fourth page PG4, that is, the MSB page.

As mentioned earlier above, if different types of pages are read from respective planes in the MPMP scheme, then different types of pages may be simultaneously read from each of the planes. Thus for example, in the first plane PL1, not only the first page PG1 of the LSB type that should be read from the first plane PL1 according to the first address ADD1 but also the second page PG2 of the type of the fourth page PG4 that should be read from the second plane PL2 according to the second address ADD2, that is, the MSB type, are simultaneously read. Accordingly, the first page buffer PB1 may sense data stored in the second page PG2 of the first memory block BLK1, and may store the sensed data in an MSB latch LCM corresponding to the type of the second page PG2, that is, the MSB page. Similarly, in the second plane PL2, not only the fourth page PG4 of the MSB type that should be read from the second plane PL2 according to the second address ADD2 but also the third page PG3 of the type of the first page PG1 that should be read from the first plane PL1 according to the first address ADD1, that is, the LSB type, are simultaneously read. Accordingly, the second page buffer PB2 may sense data stored in the third page PG3 of the second memory block BLK2, and may store the sensed data in an LSB latch LCL corresponding to the type of the third page PG3, that is, the LSB page.

After the data sensing period pDS is completed, the data output periods pDO1 and pDO2 are performed. The data output periods pDO1 and pDO2 are periods during which the data stored in the latches of the page buffers are outputted to the controller 200. During the data output periods pDO1 and pDO2, the controller 200 may provide to the nonvolatile memory device 300 control signals (e.g., a data output command DO and the addresses ADD1 and ADD2) in which the data to be outputted are stored.

The first data output period pDO1 is defined as a period during which the data sensed from the first plane PL1 are outputted. During the first data output period pDO1, data D1 and D2 of the first page PG1 stored in the LSB latch LCL of the first page buffer PB1 may be outputted to the controller 200 from the nonvolatile memory device 300, according to the data output command DO and the first address ADD1 provided from the controller 200.

The second data output period pDO2 is defined as a period during which the data sensed from the second plane PL2 are outputted. During the second data output period pDO2, data D3 and D4 of the fourth page PG4 stored in the MSB latch LCM of the second page buffer PB2 may be outputted to the controller 200 from the nonvolatile memory device 300, according to the data output command DO and the second address ADD2 provided from the controller 200.

According to an embodiment of the present disclosure, all types of pages (an LSB page and an MSB page) that should be read from the respective planes PL1 and PL2 may be read simultaneously from the planes PL1 and PL2, through only one data sensing operation. Therefore, it is possible to solve a problem caused due to the fact that a data read operation should be performed several times because types of pages that should be read from the respective planes PL1 and PL2 are different from each other.

Figure 10:
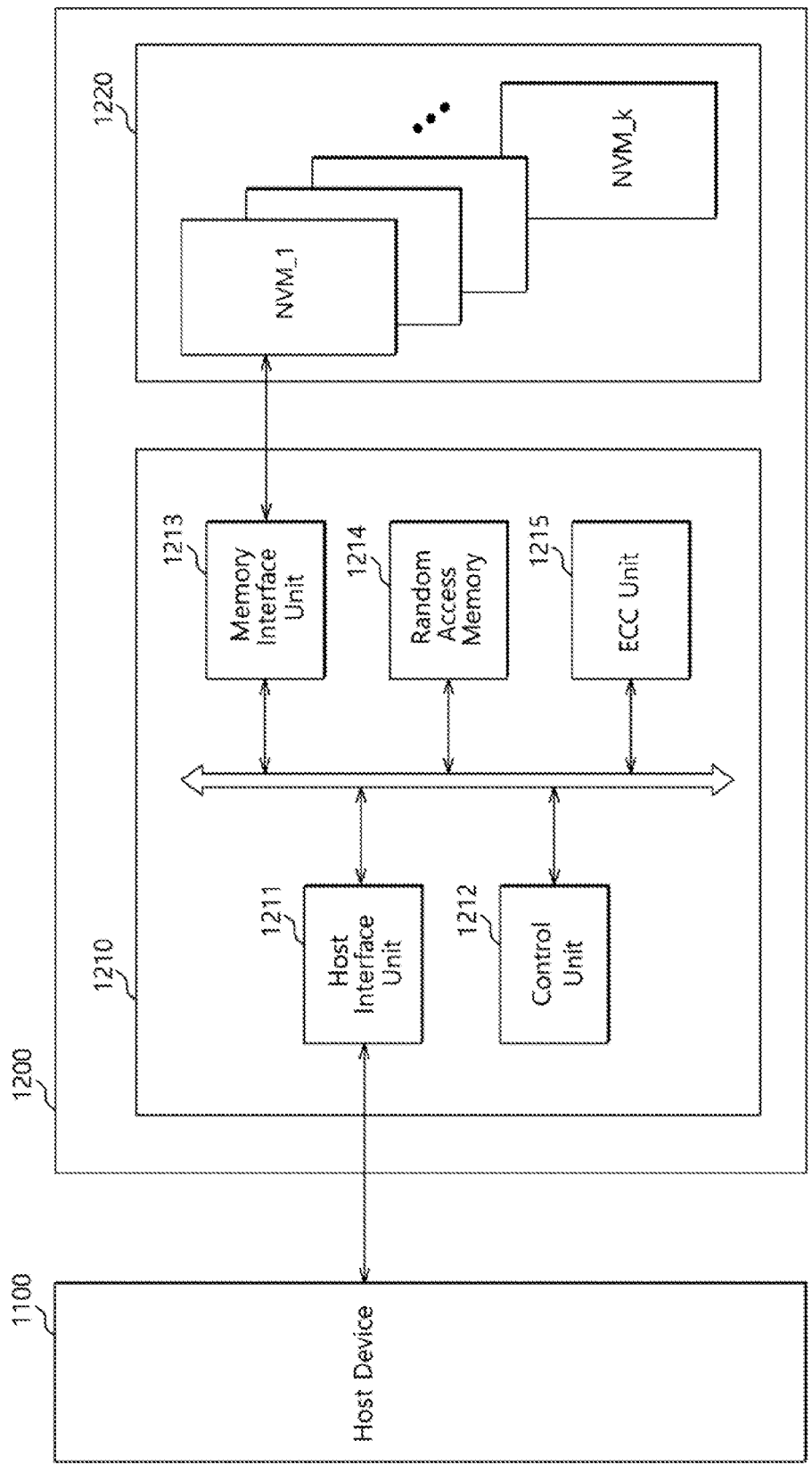
FIG. 10 is a block diagram illustrating a data processing system including a data storage device, in accordance with an embodiment of the present invention.

FIG. 10 is a block diagram illustrating a data processing system 1000 including a data storage device 1200, in accordance with an embodiment of the present invention.

According to the embodiment of FIG. 10, the data processing system 1000 may include a host device 1100 and the data storage device 1200.

The data storage device 1200 may include a controller 1210 and a nonvolatile memory device 1220. The data storage device 1200 may be coupled to the host device 1100 such as, for example, a mobile phone, an MP3 player, a laptop computer, a desktop computer, a game player, a TV, an in-vehicle infotainment system, and the like. The data storage device 1200 is also referred to as a memory system.

The controller 1210 may include a host interface unit 1211, a control unit 1212, a memory interface unit 1213, a random access memory 1214, and an error correction code (ECC) unit 1215.

The control unit 1212 may control general operations of the controller 1210 in response to a request from the host device 1100. The control unit 1212 may drive a firmware or a software for controlling the nonvolatile memory device 1220.

The control unit 1212 may control an MPMP read operation for the nonvolatile memory device 1220. If the nonvolatile memory device 1220 is controlled to perform a MPMP read operation, data stored in pages included in different planes may be sensed regardless of their memory block addresses and page addresses of the respective planes, and may be randomly outputted as needed.

The random access memory 1214 may be used as the working memory of the control unit 1212. The random access memory 1214 may be used as a buffer memory which temporarily stores data read out from the nonvolatile memory device 1220 or data provided from the host device 1100.

The host interface unit 1211 may interface the host device 1100 and the controller 1210. For example, the host interface unit 1211 may communicate with the host device 1100 through one of various interface protocols such as, for example, a universal serial bus (USB) protocol, a universal flash storage (UFS) protocol, a multimedia card (MMC) protocol, a peripheral component interconnection (PCI) protocol, a PCI express (PCI-E) protocol, a parallel advanced technology attachment (PATA) protocol, a serial advanced technology attachment (SATA) protocol, a small computer system interface (SCSI) protocol, and a serial attached SCSI (SAS) protocol.

The memory interface unit 1213 may interface the controller 1210 and the nonvolatile memory device 1220. The memory interface unit 1213 may provide a command and an address to the nonvolatile memory device 1220. Furthermore, the memory interface unit 1213 may exchange data with the nonvolatile memory device 1220.

The error correction code (ECC) unit 1215 may ECC-encode data to be stored in the nonvolatile memory device 1220. Also, the error correction code (ECC) unit 1215 may ECC-decode data read out from the nonvolatile memory device 1220.

The nonvolatile memory device 1220 may be used as the storage medium of the data storage device 1200. The nonvolatile memory device 1220 may include a plurality of nonvolatile memory chips (or dies) NVM_1 to NVM_k.

The controller 1210 and the nonvolatile memory device 1220 may be manufactured as any one of various data storage devices. For example, the controller 1210 and the nonvolatile memory device 1220 may be integrated into one semiconductor device and may be manufactured as any one of a multimedia card in the form of an MMC, an eMMC, an RS-MMC and a micro-MMC, a secure digital card in the form of an SD, a mini-SD and an micro-SD, a universal serial bus (USB) storage device, a universal flash storage (UFS) device, a Personal Computer Memory Card International Association (PCMCIA) card, a compact flash (CF) card, a smart media card, a memory stick, and the like.

Figure 11:
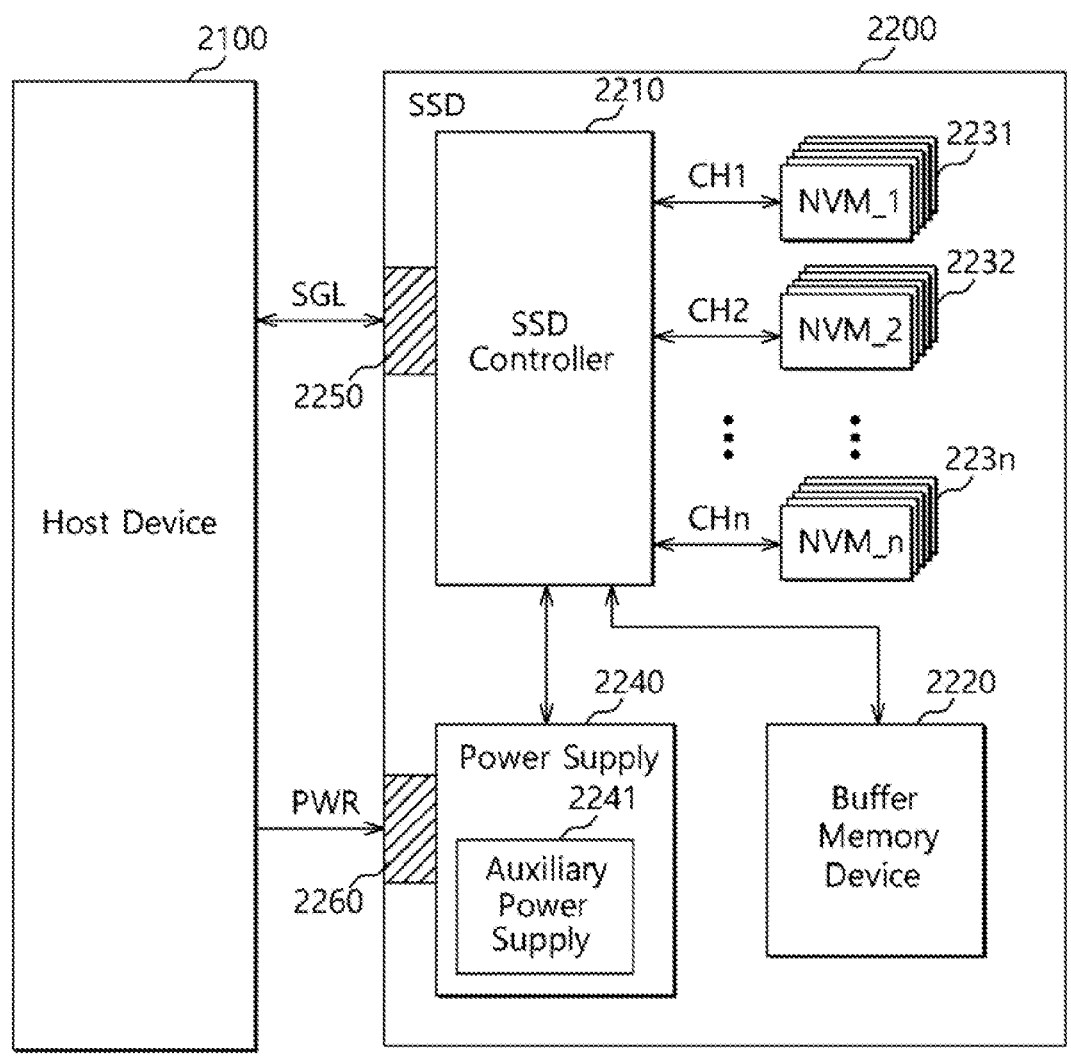
FIG. 11 is a block diagram illustrating a data processing system including a solid state drive (SSD), in accordance with an embodiment of the present invention.

FIG. 11 is a block diagram illustrating a data processing system 2000 including a solid state drive (SSD) 2200, in accordance with an embodiment of the present invention.

According to the embodiment of FIG. 11, the data processing system 2000 may include a host device 2100 and the solid state drive (SSD) 2200.

The SSD 2200 may include an SSD controller 2210, a buffer memory device 2220, nonvolatile memory devices 2231 to 223n, a power supply 2240, a signal connector 2250, and a power connector 2260.

The SSD controller 2210 may access the nonvolatile memory devices 2231 to 223n in response to a request from the host device 2100.

The buffer memory device 2220 may temporarily store data to be stored in the nonvolatile memory devices 2231 to 223n. Further, the buffer memory device 2220 may temporarily store data read out from the nonvolatile memory devices 2231 to 223n. The data temporarily stored in the buffer memory device 2220 may be transmitted to the host device 2100 or the nonvolatile memory devices 2231 to 223n under control of the SSD controller 2210.

The nonvolatile memory devices 2231 to 223*n* may be used as storage media of the SSD 2200. The nonvolatile memory devices 2231 to 223*n* may be coupled with the SSD controller 2210 through a plurality of channels CH1 to CHn, respectively. One or more nonvolatile memory devices may be coupled to each channel. The nonvolatile memory devices coupled to each channel may be coupled to the same signal bus and data bus.

The power supply 2240 may provide power PWR inputted through the power connector 2260, to the inside of the SSD 2200. The power supply 2240 may include an auxiliary power supply 2241. The auxiliary power supply 2241 may supply power so as to allow the SSD 2200 to be normally terminated when a sudden power-off occurs. The auxiliary power supply 2241 may include capacitors with large capacitance capable of charging power PWR.

The SSD controller 2210 may exchange a signal SGL with the host device 2100 through the signal connector 2250. The signal SGL may include a command, an address, data, and the like. The signal connector 2250 may be configured by a connector, such as, for example, one of parallel advanced technology attachment (PATA), serial advanced technology attachment (SATA), small computer system interface (SCSI), serial attached SCSI (SAS), peripheral component interconnection (PCI), PCI express (PCI-E) and a universal flash storage (UFS) protocols, according to an interface scheme between the host device 2100 and the SSD 2200.

Figure 12:
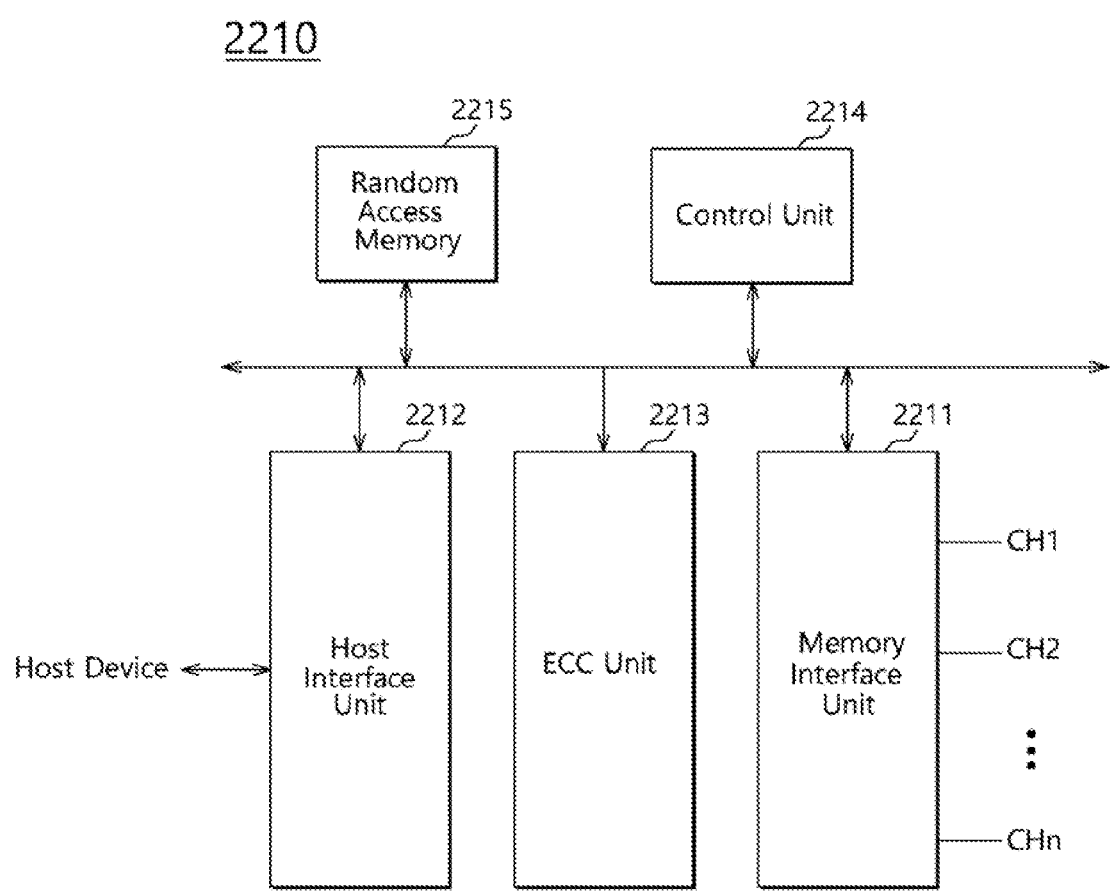
FIG. 12 is a block diagram illustrating an example configuration for the SSD controller shown in FIG. 11.

FIG. 12 is a block diagram illustrating an example configuration of the solid state drive (SSD) controller 2210 shown in FIG. 11, according to an embodiment of the invention.

According to the embodiment of FIG. 12, the SSD controller 2210 may include a memory interface unit 2211, a host interface unit 2212, an error correction code (ECC) unit 2213, a control unit 2214, and a random access memory (RAM) 2215.

The memory interface unit 2211 may provide control signals such as, for example, commands and addresses to the nonvolatile memory devices 2231 to 223*n*. Moreover, the memory interface unit 2211 may exchange data with the nonvolatile memory devices 2231 to 223*n*. The memory interface unit 2211 may direct data transmitted from the buffer memory device 2220 to the respective channels CH1 to CHn, under the control of the control unit 2214. Furthermore, the memory interface unit 2211 may transmit data read out from the nonvolatile memory devices 2231 to 223*n* to the buffer memory device 2220, under the control of the control unit 2214.

The host interface unit 2212 may provide an interface with the host device 2100 that is compatible to a certain protocol. For example, the host interface unit 2212 may communicate with the host device 2100 through one of parallel advanced technology attachment (PATA), serial advanced technology attachment (SATA), small computer system interface (SCSI), serial attached SCSI (SAS), peripheral component interconnection (PCI), PCI express (PCI-E) and a universal flash storage (UFS) protocols. In addition, the host interface unit 2212 may perform a disk emulating function of supporting the host device 2100 to recognize the SSD 2200 as a hard disk drive (HDD).

The control unit 2214 may analyze and process the signal SGL received from the host device 2100. The control unit 2214 may control operations of the buffer memory device 2220 and the nonvolatile memory devices 2231 to 223*n* according to a firmware or a software for driving the SSD 2200. The random access memory 2215 may be used as a working memory for driving the firmware or the software.

The control unit 2214 may control a multi-plane, multi-page (MPMP) read operation for the nonvolatile memory devices 2231 to 223*n*. If the nonvolatile memory devices 2231 to 223*n* are controlled to perform the multi-plane, multi-page (MPMP) read operation, data stored in pages included in different planes may be sensed regardless of memory block addresses and page addresses of the respective planes, and may be randomly outputted as may be needed.

The error correction code (ECC) unit 2213 may generate parity data to be transmitted to the nonvolatile memory devices 2231 to 223*n*, among data stored in the buffer memory device 2220. The generated parity data may be stored along with data, in the nonvolatile memory devices 2231 to 223*n*. The error correction code (ECC) unit 2213 may detect one or more errors in the data read out from the nonvolatile memory devices 2231 to 223*n*. When the detected errors are within a correctable range, the error correction code (ECC) unit 2213 may correct the detected errors.

Figure 13:
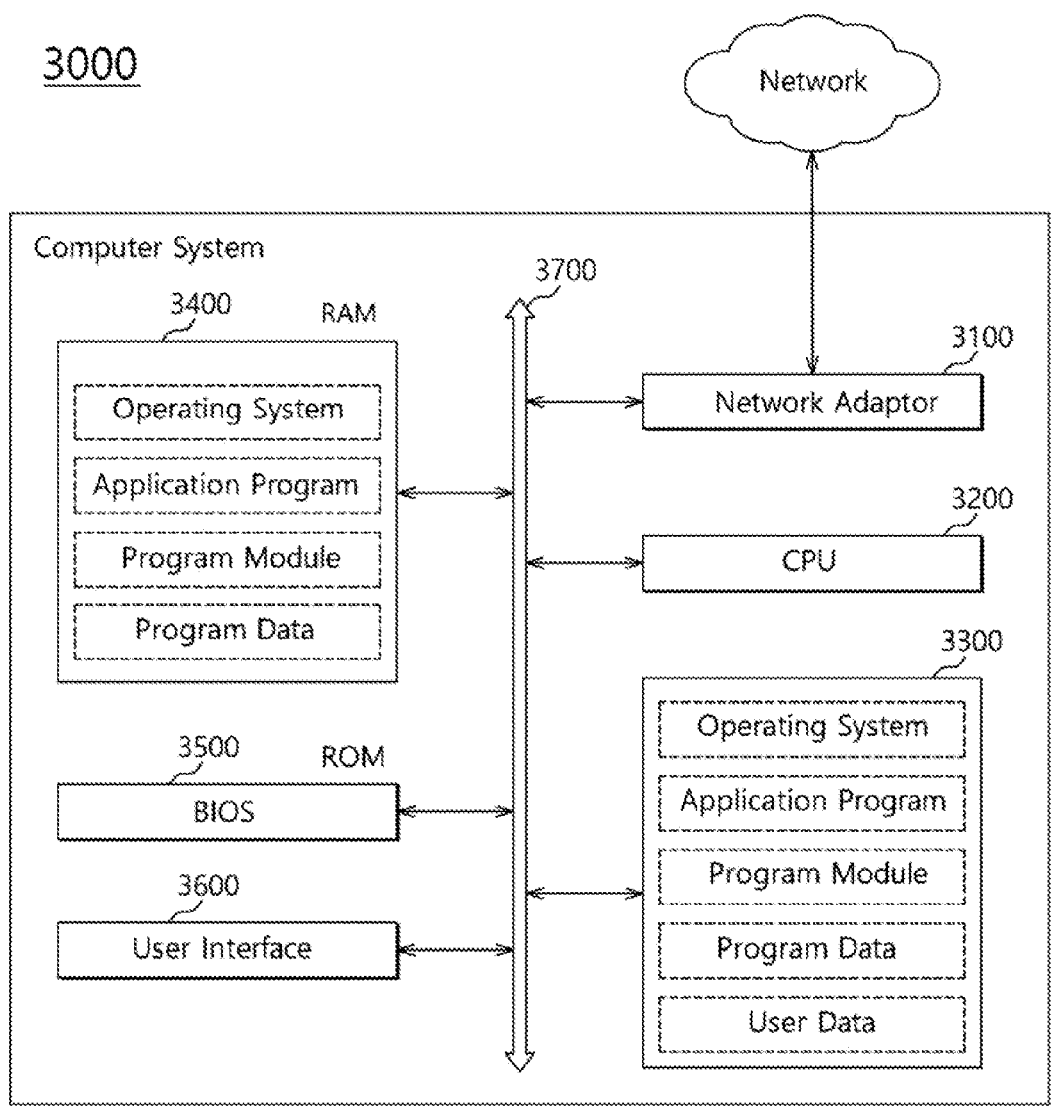
FIG. 13 is a block diagram illustrating a computer system to including a data storage device, in accordance with an embodiment of the invention.

FIG. 13 is a block diagram illustrating a computer system 3000 including a data storage device 3300, in accordance with an embodiment is mounted.

According to the embodiment of FIG. 13, the computer system 3000 may include a network adaptor 3100, a central processing unit (CPU) 3200, the data storage device 3300, a random access memory (RAM) 3400, a read only memory (ROM) 3500 and a user interface 3600, which are coupled electrically to a system bus 3700. The data storage device 3300 may be or include the data storage device 100 shown in FIG. 1, the data storage device 1200 shown in FIG. 10 or the SSD 2200 shown in FIG. 11.

The network adaptor 3100 may provide interfacing between the computer system 3000 and external networks. The central processing unit 3200 may perform general calculation processing for driving an operating system residing at the RAM 3400 or an application program.

The data storage device 3300 may store general data needed in the computer system 3000. For example, an operating system for driving the computer system 3000, an application program, various program modules, program data and user data may be stored in the data storage device 3300.

The RAM 3400 may be used as the working memory of the computer system 3000. Upon booting, the operating system, the application program, the various program modules and the program data needed for driving programs, which are read out from the data storage device 3300, may be loaded on the RAM 3400. A basic input/output system (BIOS) which is activated before the operating system is driven may be stored in the ROM 3500. Information exchange between the computer system 3000 and a user may be implemented through the user interface 3600.

Figure 14:
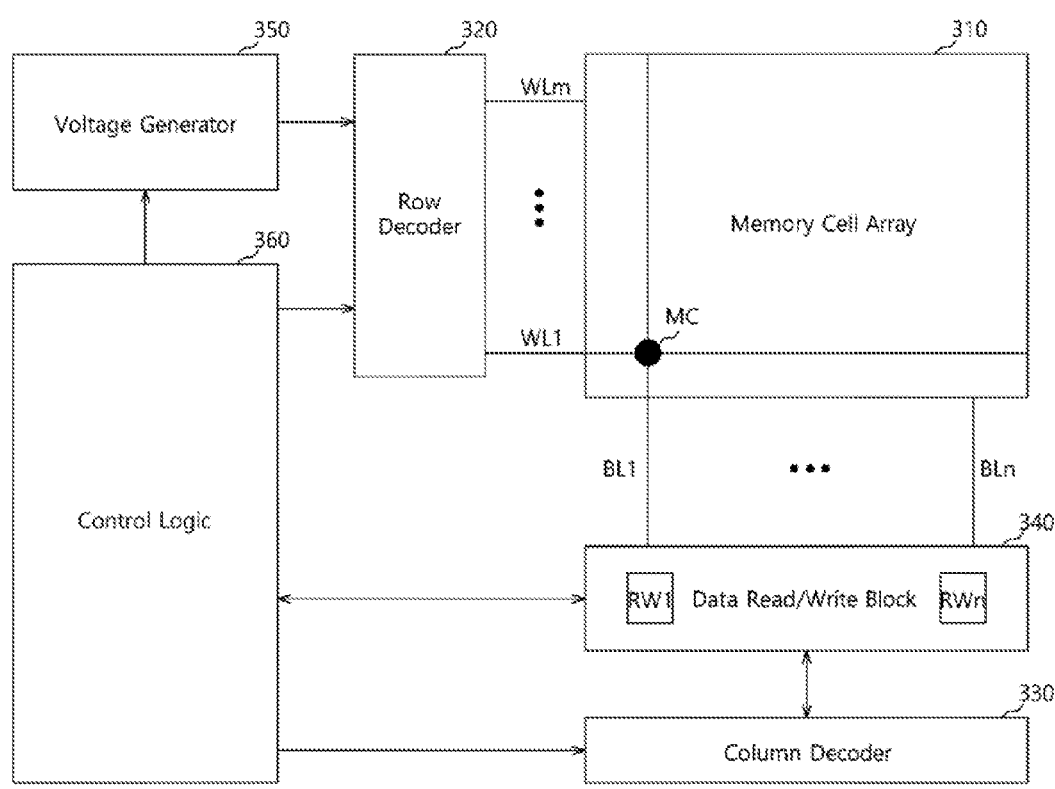
FIG. 14 is a block diagram illustrating a nonvolatile memory device included in a data storage device, in accordance with an embodiment of the present invention.

FIG. 14 is a block diagram illustrating a nonvolatile memory device 300 included in a data storage device, in accordance with an embodiment of the present invention.

According to the embodiment of FIG. 14, the nonvolatile memory device 300 may include a memory cell array 310, a row decoder 320, a column decoder 330, a data read/write block 340, a voltage generator 350, and a control logic 360.

The memory cell array 310 may include memory cells MC which are arranged at areas where word lines WL1 to WLm and bit lines BL1 to BLn intersect with each other. Although not shown, the memory cell array 310 may be configured by a plurality of planes in the same manner as the memory cell region 310 shown in FIG. 1.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 340 may be coupled with the memory cell array 310 through the bit lines BL1 to BLn. The data read/write block 340 may include read/write circuits RW1 to RWn respectively corresponding to the bit lines BL1 to BLn. The data read/write block 340 may operate according to control of the control logic 360. The data read/write block 340 may operate as a write driver or a sense amplifier according to an operation mode. For example, the data read/write block 340 may operate as a write driver for storing data provided from the external device, in the memory cell array 310 in a write operation. For another example, the data read/write block 340 may operate as a sense amplifier for reading out data from the memory cell array 310 in a read operation.

The column decoder 330 may operate according to control of the control logic 360. The column decoder 330 may decode an address provided from the external device. The column decoder 330 may couple the read/write circuits RW1 to RWn of the data read/write block 340 respectively corresponding to the bit lines BL1 to BLn with data input/output lines (or data input/output buffers), based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control operations of the nonvolatile memory device 300 such as, for example, read, write and erase operations of the nonvolatile memory device 300. Also, the control logic 360 may control internal operations as shown in FIG. 9 to be performed, when a multi-plane, multi-page (MPMP) read operation is requested from the external device.

While various embodiments have been described above, it will be understood to those skilled in the relevant art that the described embodiments are only examples of the present invention. Accordingly, the present invention should not be limited to the described embodiments.

It will be apparent to those skilled in the relevant art that various changes and modifications may be made without departing from the spirit and scope of the present invention as defined in the following claims.

What is claimed is:

1. A data storage device comprising:
a nonvolatile memory device including a first plane and a second plane; and
a controller suitable for providing to the nonvolatile memory device a read command for reading simultaneously the first plane and the second plane, a first address for accessing the first plane and a second address for accessing the second plane,
wherein the nonvolatile memory device simultaneously reads two types of pages from each of the first plane and the second plane when a type of a page corresponding to the first address and a type of a page corresponding to the second address are different, and simultaneously reads one type of pages from each of the first plane and the second plane when a type of the page corresponding to the first address and a type of the page corresponding to the second address are the same.

2. The data storage device according to claim 1, wherein, in the case where a page to be read according to the first address is a first type page and a page to be read according to the second address is a second type page, the nonvolatile memory device reads the first type page and the second type page from the first plane and reads the first type page and the second type page from the second plane.

3. The data storage device according to claim 2, wherein the first type page and the second type page are configured by memory cells which are coupled to the same word line.

4. The data storage device according to claim 3,
wherein the first type page is configured by a least significant bit (LSB) page for storing lower bit data, and
wherein the second type page is configured by a most significant bit (MSB) page for storing upper bit data.

5. The data storage device according to claim 3,
wherein the first and second type pages are each configured by a least significant bit (LSB) page for storing lower bit data, a most significant bit (MSB) page for storing upper bit data, or a central significant bit (CSB).

6. The data storage device according to claim 2, wherein the nonvolatile memory device further includes:
a first page buffer corresponding to the first plane, and including a first latch for storing data sensed from the first type page and a second latch for storing data sensed from the second type page; and
a second page buffer corresponding to the second plane, and including a first latch for storing data sensed from the first type page and a second latch for storing data sensed from the second type page.

7. The data storage device according to claim 6, wherein the controller provides, after the data sensed from the first type page is stored in the first latch of the first page buffer and the data sensed from the second type page is stored in the second latch of the first page buffer, a data output command and the first address to the nonvolatile memory device.

8. The data storage device according to claim 7, wherein the nonvolatile memory device outputs the data stored in the first latch of the first page buffer to the controller, according to the first address.

9. The data storage device according to claim 6, wherein the controller provides, after the data sensed from the first type page is stored in the first latch of the second page buffer and the data sensed from the second type page is stored in the second latch of the second page buffer, a data output command and the second address to the nonvolatile memory device.

10. The data storage device according to claim 9, wherein the nonvolatile memory device outputs the data stored in the second latch of the second page buffer to the controller, according to the second address.

11. The data storage device according to claim 1, wherein, in the case where pages to be read according to the first address and the second address are any one of a first type and a second type, the nonvolatile memory device reads a page of any one type of the first type and the second type from each of the first plane and the second plane.

12. A method for operating a data storage device including a nonvolatile memory device including a first plane and a second plane, the method comprising:
   providing to the nonvolatile memory device a read command for reading simultaneously the first plane and the second plane, a first address for accessing the first plane and a second address for accessing the second plane; and
   simultaneously reading from the nonvolatile memory device, two types of pages from each of the first plane and the second plane when a type of a page corresponding to the first address and a type of a page corresponding to the second address are different, and simultaneously reading one type of pages from each of the first plane and the second plane when a type of the page corresponding to the first address and a type of the page corresponding to the second address are the same.

13. The method of claim 12, wherein the reading of the two types of pages and the one type of pages comprises:
   in the case where a page to be read according to the first address is a first type page and a page to be read according to the second address is a second type page, reading the first type page and the second type page from the first plane and reads the first type page and the second type page from the second plane.

14. The method of claim 13, wherein the first type page and the second type page are configured by memory cells which are coupled to the same word line.

15. The method of claim 14, wherein the first type page is configured by a least significant bit (LSB) page for storing lower bit data, and the second type page is configured by a most significant bit (MSB) page for storing upper bit data.

16. The method of claim 14, wherein the first and second type pages are each configured by a least significant bit (LSB) page for storing lower bit data, a most significant bit (MSB) page for storing upper bit data, or a central significant bit (CSB).

17. The method of claim 13, wherein the nonvolatile memory device includes:
   a first page buffer corresponding to the first plane, and including a first latch for storing data sensed from the first type page and a second latch for storing data sensed from the second type page; and
   a second page buffer corresponding to the second plane, and including a first latch for storing data sensed from the first type page and a second latch for storing data sensed from the second type page.

18. The method of claim 17, further comprising:
   providing, by the controller, a data output command and the first address to the nonvolatile memory device, after the data sensed from the first type page is stored in the first latch of the first page buffer and the data sensed from the second type page is stored in the second latch of the first page buffer.

19. The method of claim 18, further comprising:
   outputting, by the nonvolatile memory device, the data stored in the first latch of the first page buffer to the controller, according to the first address.

20. The method of claim 17, further comprising:
   providing, by the controller, a data output command and the second address to the nonvolatile memory device, after the data sensed from the first type page is stored in the first latch of the second page buffer and the data sensed from the second type page is stored in the second latch of the second page buffer.

21. The method of claim 20, further comprising:
   outputting, by the nonvolatile memory device, the data stored in the second latch of the second page buffer to the controller, according to the second address.

22. The method of claim 12, wherein the reading of the all page types comprises:
   reading, by the nonvolatile memory device, a page of any one type of the first type and the second type from each of the first plane and the second plane, in the case where pages to be read according to the first address and the second address are any one of a first type and a second type.

* * * * *